US012672394B2

(12) United States Patent (10) Patent No.: US 12,672,394 B2
Ahmed et al. (45) Date of Patent: Jun. 30, 2026

(54) MICRO LIGHT EMITTING DIODE WITH METASURFACE REFLECTORS

(71) Applicant: Intel Corporation, Santa Clara, CA (US)

(72) Inventors: Khaled Ahmed, San Jose, CA (US); Joshua Fryman, Corvallis, OR (US); Junyi Qiu, Portland, OR (US); Mozhgan Mansuri, Portland, OR (US); James Jaussi, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 415 days.

(21) Appl. No.: 18/508,617

(22) Filed: Nov. 14, 2023

(65) Prior Publication Data

US 2025/0160059 A1 May 15, 2025

(51) Int. Cl.
H10H 20/814 (2025.01)
H10H 20/825 (2025.01)
H10H 20/857 (2025.01)
H10W 90/00 (2026.01)

(52) U.S. Cl.
CPC ...... *H10H 20/8142* (2025.01); *H10H 20/825* (2025.01); *H10H 20/857* (2025.01); *H10W 90/00* (2026.01)

(58) Field of Classification Search
CPC .......................... H10H 20/8142; H10H 20/857
See application file for complete search history.

(56) References Cited

U.S. PATENT DOCUMENTS

2024/0274756 A1 * 8/2024 Li ...................... H10H 20/8512
2024/0355959 A1 * 10/2024 Dannoune ............ H10H 20/819

* cited by examiner

*Primary Examiner* — Steven M Page
(74) *Attorney, Agent, or Firm* — Akona IP PC

(57) ABSTRACT

A micro-LED includes a light emitter between a pair of reflective metasurfaces formed from nanostructures. The metasurfaces have different levels of reflectivity, with one metasurface reflecting nearly all light, and the other metasurface allowing some light to pass through. The reflections of the light within the micro-LED result in an improved radiation recombination rate, which results in an increased modulation speed. In addition, the light emitted from the micro-LED has a relatively narrow divergence angle and narrow emission linewidth, making the micro-LED suitable for optical communications.

20 Claims, 20 Drawing Sheets

420a

420b

| | 206 | | 208 | | 212 | | 214 | | 216 | | 402 |

422

| | 206 | | 208 | | 210 | | 212 | | 214 | | 216 | | 402 |

204    206    208    210    212    214    216    402

220

| | | | | | | | | |
|---|---|---|---|---|---|---|---|---|
| ☐ 202 | ⊞ 204 | ▦ 206 | ■ 208 | ▨ 210 | ░ 212 | ▨ 214 | ▨ 216 | ▨ 402 |

202    204    206    208    210    212    214    216    402

| | | | | | | | |
|---|---|---|---|---|---|---|---|
| □ 202 | ⊞ 204 | ⬚ 206 | ■ 208 | ▨ 210 | ⬚ 212 | ⬚ 214 | ▨ 216 |

228

| | | | | | | | |
|---|---|---|---|---|---|---|---|
| ☐ 202 | ⊞ 204 | ⬚ 206 | ■ 208 | ▨ 210 | ⬚ 212 | ⬚ 214 | ▨ 216 |

☐ 202    ⊞ 204    ☐ 206    ▦ 208    ▦ 210    ▦ 212    ▦ 214    ▦ 216

MICRO LIGHT EMITTING DIODE WITH METASURFACE REFLECTORS

BACKGROUND

Micro light emitting diodes (LEDs) are tiny, self-emissive LEDs, typically on the scale of micrometers. They can provide high brightness, energy efficiency, and color accuracy, making them useful for various display applications, such high-resolution displays in smartphones, TVs, and augmented reality (AR) devices, as well as heads-up displays in automotive and aviation industries. Their compact size and superior efficiency make them a compelling choice for various emerging technologies and industries, including optical communications.

BRIEF DESCRIPTION OF THE DRAWINGS

Embodiments will be readily understood by the following detailed description in conjunction with the accompanying drawings.

DETAILED DESCRIPTION

Figure 1:
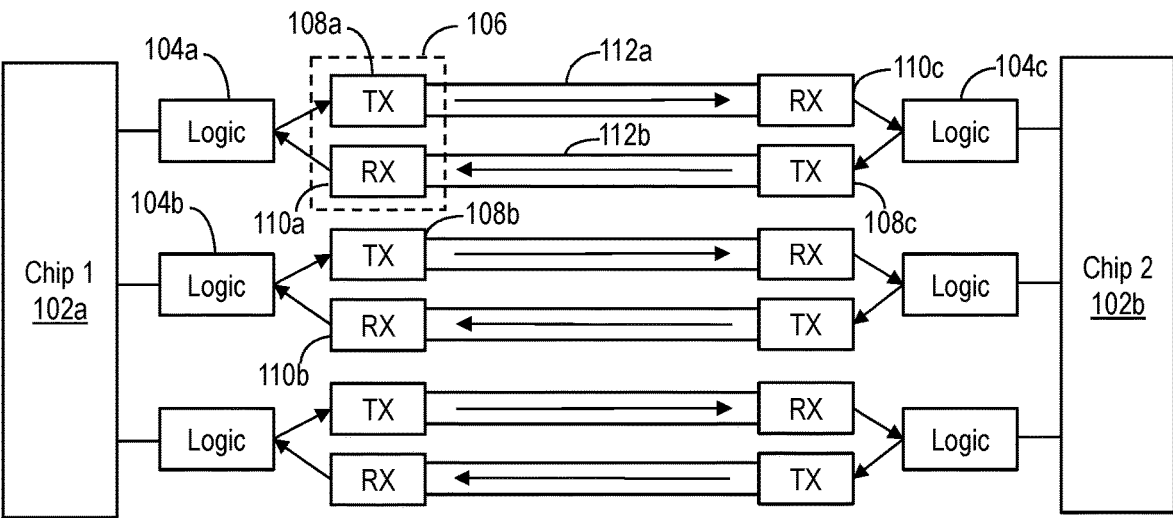
FIG. 1 is a block diagram of a micro-LED based optical interconnect system, according to various embodiments.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating the micro-LEDs proposed herein, it might be useful to first understand phenomena that may come into play in context of micro-LEDs and metasurfaces. The following foundational information may be viewed as a basis from which the present disclosure may be properly explained. Such information is offered for purposes of explanation only and, accordingly, should not be construed in any way to limit the broad scope of the present disclosure and its potential applications.

Metal communication lines, such as copper or aluminum wires, have traditionally been used for communication within and between microelectronic devices. Metals are excellent conductors of electricity, and they facilitate the transmission of electrical signals over short distances at very high speeds. Metal interconnects are commonly used for on-chip communication, connecting transistors, logic gates, and other components within a microchip. However, as microelectronics have continued to shrink in size and increase in complexity, the limitations of metal interconnects have become more apparent. These limitations include resistance, capacitance, and signal propagation delays, which can lead to power consumption, heat generation, and signal integrity issues.

Optical communications provide an alternative to metal interconnects in microelectronics. Optical connections use light to transmit data within and between electronic components. Optical communications can address some of the limitations of metal interconnects and offer several advantages, including high-speed data transfer, immunity to electromagnetic interference, and lower power consumption. Typically, lasers are used to as a source of light; optical transmitter circuitry encodes an electrical signal into an optical signal by adjusting a property of the optical signal emitted by the laser, such as by changing a phase, amplitude, or polarization of the optical signal. However, many lasers are temperature dependent, with reduction in functionality at high temperatures. When lasers are used with traditional microelectronics devices, which tend to emit heat, the optical communications may be disrupted.

Micro-LEDs have been considered for use in optical communications applications, such as parallel optical interconnects (POIO), where multiple micro-LEDs are arranged in parallel to provide multiple communications channels. Micro-LEDs have small footprints, so that a relatively large number (e.g., hundreds or thousands) may be coupled to a chip, providing a large number of parallel pathways. Furthermore, micro-LEDs typically have better functionality at higher temperatures, which may make them more suitable for use in microelectronics devices than lasers. As used herein, the term "micro-LED" refers to light-emitting devices that are generally rectangular in cross-section and that have a cross-sectional area of less than 100 square microns (e.g., less than 10 microns by 10 microns length per side for a square-shaped micro-LED), in some implementations micro-LEDs in accordance with this disclosure have cross-sectional areas ranging from about 25 square microns (about 5 microns length per side) to about 50 square microns (about 7 microns length per side). By contrast, larger LEDs, such as miniature LEDs or "mini-LEDs" commonly found in large area displays have cross-sectional areas that are at least an order of magnitude larger than the cross-sectional area of a micro-LED. For example, some mini-LEDs have cross-sectional areas of 2,500 square microns or larger.

While providing better operation at higher temperatures than lasers, micro-LEDs have other challenges to overcome to practically enable optical communications. For example, a suitable light source for optical communications should have a sufficiently narrow divergence angle (e.g., less than 30 degrees), a sufficiently narrow emission linewidth (e.g., less than 10 nanometers (nm) at a peak emission wavelength of less than 450 nm), and a sufficiently high modulation frequency (e.g., at least 1 gigahertz (GHz)); the design of the light source should also allow for reliable, high-volume manufacturing. Previous micro-LEDs developed for optical communications, such as nanowire LEDs, do not meet these benchmarks. While lenses, filters, and other optical elements may be added onto existing micro-LEDs to improve certain characteristics, adding such optical elements increases size and manufacturing complexity, which may result in higher production costs and/or reduced yield.

Disclosed herein are micro-LEDs, as well as packages and systems including micro-LEDs, that aim to improve on one or more challenges described above. Optical metasurfaces are used to create reflective surfaces around light emitters that enable the micro-LEDs to meet the benchmarks described above. Optical metasurfaces are sub-wavelength patterned layers that interact with light and can be used to alter the properties of light over a sub-wavelength thickness. In contrast to conventional optics, which rely on light refraction and propagation, metasurfaces offer a new method of light manipulation that is based on scattering from small nanostructures. For example, nanostructures can resonantly capture the light and re-emit it with a defined phase, polarization, modality and spectrum, thus allowing the sculpting of light waves with a high degree of accuracy.

The micro-LEDs structures described herein include two reflective surfaces with different rates of reflectivity, where one surface is nearly fully reflective (e.g., at least 98% or at least 99%), and the opposite surface allows a greater amount of light to pass through, e.g., 10% emission and 90% reflection. The micro-LED with metasurfaces results in highly focused light with a narrow divergence angle (e.g., less than 30 degrees) without the need for a lens. Furthermore, reflecting the light within the cavity produces device characteristics of a resonant-cavity LED, such as an improved radiation recombination rate which results in an increased modulation speed. In addition to providing reflection, the metasurfaces may be designed to steer light, e.g., using a dispersive phase gradient method. In some cases, the metasurfaces may be designed to provide a lens effect for additional reduction of the divergence angle.

An example micro-LED includes an active light-emitting layer, also referred to as a quantum well, formed between two layers of semiconductor material. A reflective metasurface, also referred to as a metasurface mirror, is formed across the faces of the semiconductor layers opposite the quantum well. The metasurface may be formed from nanoparticles of a dielectric material, such as titanium oxide. The nanoparticles in the two metasurfaces may have different sizes and/or pitches to provide the different degrees of reflectivity. In some embodiments, a metasurface may be formed over a layer of a transparent layer, such as a transparent conductive layer formed over a semiconductor layer. The micro-LEDs with reflective metasurfaces as described herein may be used in a variety of applications, e.g., in optical transmitters for intra-die communications or inter-die communications. Optical transmitters including micro-LEDs described herein may be coupled to other optical elements, such as waveguides, or may be configured to emit into free-space optic channels.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Any of the features discussed with reference to any of accompanying drawings herein may be combined with any other features to form a micro-LED based optical interconnect system 100, a micro-LED 200, a microelectronic package 2200, or a photonic device 2300, as appropriate. A number of elements of the drawings with same reference numerals may be shared between different drawings; for ease of discussion, a description of these elements provided with respect to one of the drawings is not repeated for the other drawings, and these elements may take the form of any of the embodiments disclosed herein. The drawings are not necessarily to scale. Although some of the drawings illustrate rectilinear structures with flat walls/surfaces and right-angle corners, this is simply for ease of illustration and may not reflect real-life process limitations which may cause various features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers. There may be other defects not listed here but that are common within the field of semiconductor device fabrication and packaging. Inspection of layout and mask data and reverse engineering of parts of a device to reconstruct the circuit using e.g., optical microscopy or transmission electron microscopy, and/or inspection of a cross-section of a device to detect the shape and the location of various device elements described herein using, e.g., Physical Failure Analysis (PFA) would allow determination of presence of micro-LEDs with reflective metasurfaces as described herein.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used to describe a range of dimensions, the phrase "between X and Y" represents a range that includes X and Y. When used to describe a location of an element, the phrase "between X and Y" represents a region that is spatially between element X and element Y. The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−10%, e.g., within +/−5% or within +/−2%, of the exact orientation.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, the terms "package" and "integrated circuit (IC) package" are synonymous, as are the terms "die" and "IC die." Furthermore, the terms "chip," "chiplet," "die," and "IC die" may be used interchangeably herein. Although certain elements may be referred to in the singular herein, such elements may include multiple sub-elements. For example, "an insulator material" may include one or more insulator materials.

FIG. 1 is a block diagram of a micro-LED based optical interconnect system 100, according to various embodiments. The system 100 couples a first chip 102a to a second chip 102b, providing chip-to-chip communication. Each chip 102 may be, for example, a logic device (e.g., a die with transistors arranged to provide computing or processing functionality), a memory device (e.g., a die with transistors, capacitors, and/or other components arranged to store data), or a device with both logic and memory capabilities. The chips 102a and 102b may be arranged in a multi-die IC package, for example.

Each chip 102 is coupled to a set of communications logic blocks 104, each of which is coupled to a respective transmit/receive (TX/RX) pixel 106. Each TX/RX pixel 106 includes a transmitter 108 and a receiver 110. For example, the TX/RX pixel 106 labelled in FIG. 1 includes a transmitter 108a and a receiver 110a. A logic block 104 may receive data for communication from a chip 102 and format the data for transmission via a TX/RX pixel 106, e.g., for transmission via the transmitter 108a. A logic block 104 may also receive data from a TX/RX pixel 106 (e.g., from the receiver 110a) and perform data validation, decompression, formatting, etc. prior to delivery of the data to the chip 102. Each logic block 104 is coupled to a similar TX/RX pixel 106, e.g., the logic block 104b coupled to chip 1 102a is coupled to the transmitter 108b and the receiver 110b, and the logic block 104c coupled to chip 2 102b is coupled to the transmitter 108c and the receiver 110c.

Figure 2:
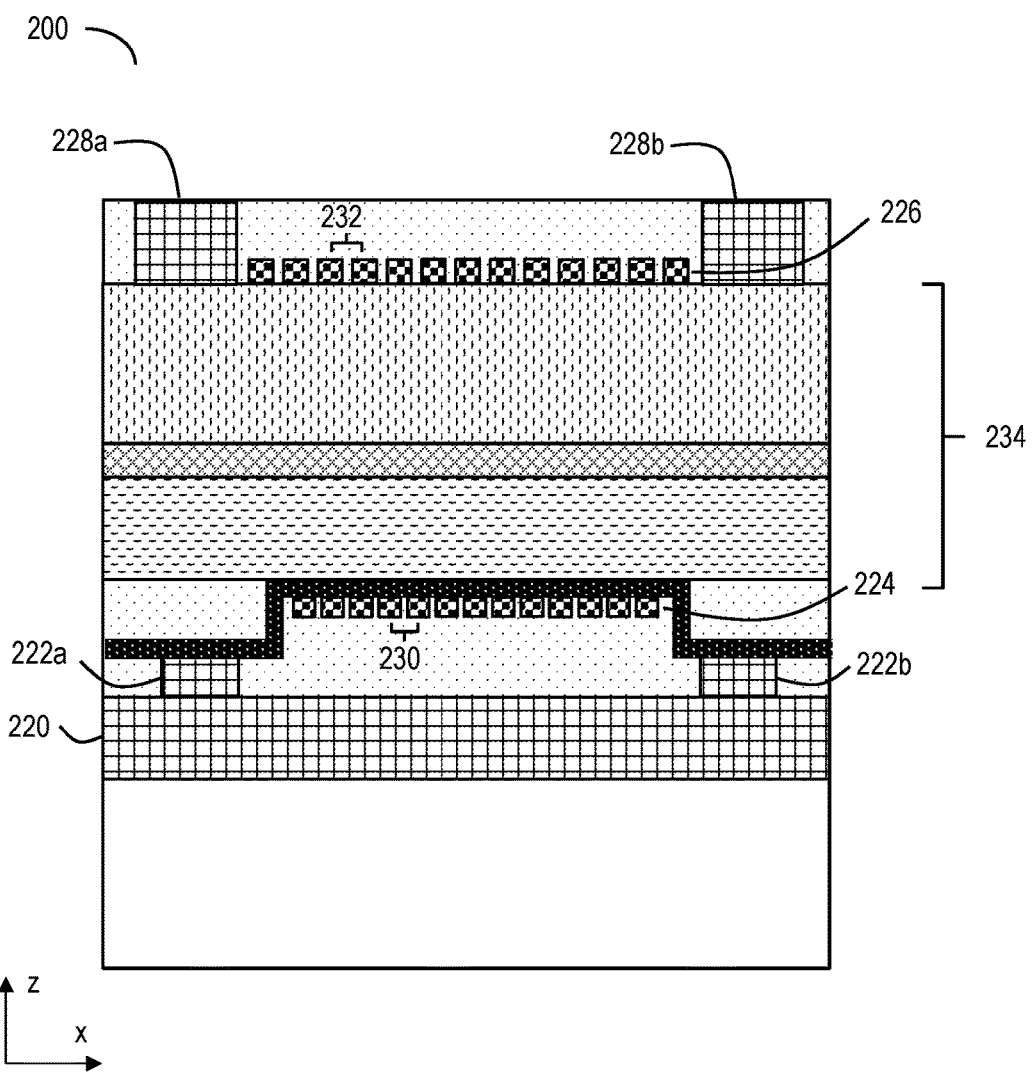
FIG. 2 is an example cross-section of a micro-LED with reflective metasurfaces, according to various embodiments.

Each transmitter 108 may include a micro-LED with reflective metasurfaces, e.g., the micro-LED illustrated in FIG. 2. The transmitters 108 may further include, for example, a modulator for encoding a data signal from the logic 104 onto the optical signal generated by the transmitter 108; a driver circuit for controlling the modulator; an optical coupler for coupling the output of the transmitter 108 to a propagation medium, such as a waveguide; and other components. Each receiver 110 may include, for example, an optical coupler for coupling the output of the propagation medium (e.g., a waveguide) to the receiver 110, a photodetector, one or more filters, amplifiers, signal processors, etc.

In this example, the transmitters 108 and receivers 110 are coupled to waveguides 112. For example, the transmitter 108a coupled to chip 1 102a (via the logic block 104a) is coupled to a waveguide 112a, which propagates an optical signal to the receiver 110c coupled to chip 2 102b (via the logic block 104c). The receiver 110a coupled to chip 1 102a (via the logic block 104a) is coupled to a waveguide 112b to receive an optical signal transmitted from the transmitter 108c coupled to chip 2 102b (via the logic block 104c). In this example, each waveguide 112 propagates an optical signal in a single direction. The light propagating in the direction from chip 1 102a to chip 2 102b may have a different frequency from the light propagating in the direction from chip 2 102b to chip 1 102a, e.g., to minimize latency and crosstalk.

FIG. 2 is an example cross-section of a micro-LED 200 with reflective metasurfaces, according to various embodiments. A number of elements referred to in the description of FIG. 2 with reference numerals are illustrated in these figures with different patterns, with a legend at the bottom of the page showing the correspondence between the reference numerals and patterns. The legend illustrates that FIG. 2 uses different patterns to show a support structure 202, a conductive material 204, a dielectric material 206, a transparent conductor 208, a dielectric nanostructure material 210, a first semiconductor material 212, a second semiconductor material 214, and a light emitting material 216.

Figure 9A:
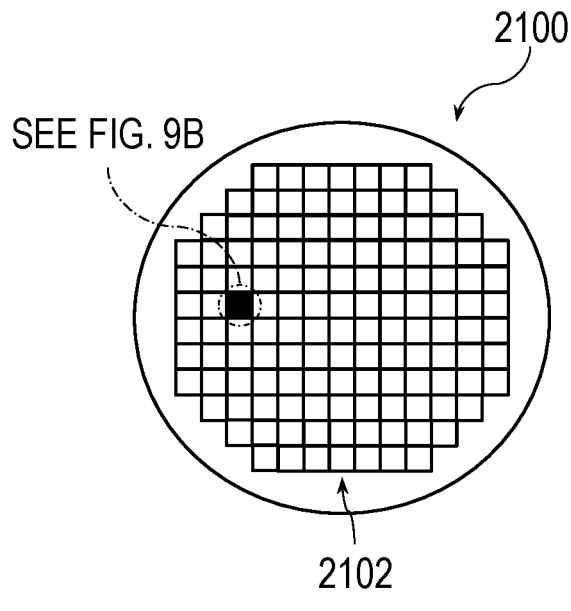
FIG. 9A is a top view of a wafer that may include one or more micro-LEDs with reflective metasurfaces, according to various embodiments.
Figure 9B:
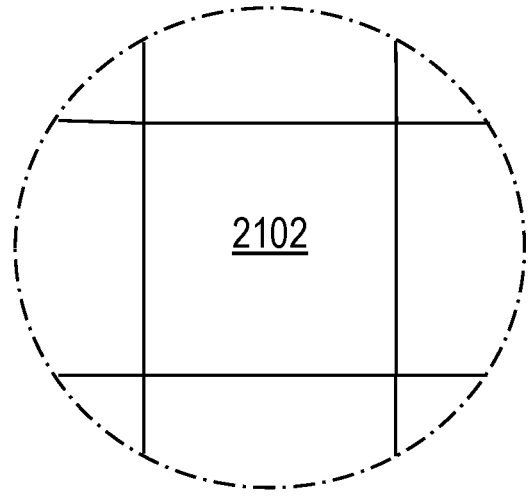
FIG. 9B is a top view of dies that may be included in a microelectronic package or a photonic device with one or more micro-LEDs with reflective metasurfaces, according to an embodiment.

In general, implementations of the present disclosure may be formed or carried out on a support structure, e.g., the support structure 202 illustrated in FIG. 2. The support structure 202 may be, e.g., a substrate, a die, a wafer or a chip. For example, the support structure 202 may be the wafer 2100 of FIG. 9A, discussed below, and may be, or be included in, a die, e.g., the singulated die 2102 of FIG. 9B, discussed below. The support structure 202 extends along the x-y plane in the coordinate system shown in FIG. 2.

In some embodiments, the support structure may be a substrate that includes silicon and/or hafnium. More generally, the support structure may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure may be a printed circuit board (PCB) substrate. Although a few examples of materials from which the substrate may be formed are described here, any material that may serve as a foundation upon which micro-LED with reflective metasurfaces, as described herein, may be built falls within the spirit and scope of the present disclosure.

The conductive material 204 may include a metal, such as copper or aluminum. A layer 220 of the conductive material 204 is over the support structure 202. In addition, two contacts 222a and 222b (referred to as contacts 222) are over the layer 220. The transparent conductor 208 is over the layer 220 of the conductive material 204, and over and in contact with the contacts 222. The transparent conductor 208 may be a transparent conductive oxide, such as indium tin oxide (ITO), aluminum zinc oxide (AZO), indium zinc oxide (IZO), indium cadmium oxide, or another transparent, conductive material. In this example, the transparent conductor 208 is formed across multiple layers in the z-direction, with a portion of the transparent conductor 208 in contact with the contacts 222, and another portion of the transparent conductor 208 at a higher position in the z-direction, in an area between the contacts 222. In other examples, the transparent conductor 208 may be formed across a single layer, or in other arrangements.

In the region between the contacts 222, a dielectric material 206 is between the transparent conductor 208 and the layer 220 of the conductive material 204. The dielectric material 206 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials 206 include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

A first set of nanostructures 224 are below the transparent conductor 208 in a region between the contacts 222*a* and 222*b* (in the x-direction). The nanostructures 224 are formed from a dielectric nanostructure material 210, which may be a dielectric material that includes oxygen (e.g., titanium oxide or aluminum oxide) or nitrogen (e.g., silicon nitride or titanium nitride). The nanostructures 224 form a metasurface across a portion of the transparent conductor 208, where the metasurface extends in the x-direction and the y-direction. The nanostructures 224 may have various shapes, e.g., cubes, cylinders, rectangular prisms, parallelepipeds, etc. The nanostructures 224 may be arranged to reflect substantially all light incident on the nanostructures 224, e.g., at least 98%, at least 98.5%, at least 99%, at least 99.5%, at least 99.9%, or a different amount of light incident on the nanostructures 224.

The nanostructures 224 are arranged with a pitch, where pitch refers to a center-to-center distance between closest adjacent structures, i.e., a center-to-center distance between neighboring nanostructures 224. For example, a pitch 230 between two adjacent nanostructures 224 is illustrated in FIG. 2. The pitch may be consistent across the metasurface, or may vary across the metasurface, as described with respect to FIG. 7. The pitch 230 of at least a portion of the nanostructures 224 may be between 100 nm to 800 nm or within a range therein, e.g., between 100 and 200 nm, between 200 and 400 nm, or between 400 and 800 nm.

The nanostructures 224 also have a width, where width is measured in the x-direction in the coordinate system shown. The width may be consistent across the metasurface, or may vary across the metasurface, as described with respect to FIG. 7. The nanostructures 224 may have a width between 40 nm to 80 nm.

A layer of the first semiconductor material 212 is over the transparent conductor 208, with the transparent conductor 208 in contact with the first semiconductor material 212. A layer of the second semiconductor material 214 is over the first semiconductor material 212, with a layer of the light emitting material 216 between the layer of the first semiconductor material 212 and the layer of the second semiconductor material 214. The first semiconductor material 212 may be a p-type semiconductor, such as p-doped gallium nitride (P—GaN), and the second semiconductor material 214 may be an n-type semiconductor, such as n-doped gallium nitride (N—GaN). The layer of light emitting material 216 may include indium gallium nitride (InGaN) so that, in some implementations, layer 216 may substantially comprise a mixture of indium, gallium and nitrogen atoms. The light emitting material 216 may also be referred to as an active layer or as a quantum well layer. In other embodiments, different materials systems may be used.

A second set of nanostructures 226 formed from the dielectric nanostructure material 210 and a second pair of contacts 228*a* and 228*b* are over the layer of the second semiconductor material 214. The nanostructures 226 are in a region between the contacts 228*a* and 228*b* (in the x-direction). In this example, both the contacts 228 and the nanostructures 226 are in contact with the second semiconductor material 214. In another example, a transparent conductive layer (e.g., the transparent conductor 208) may be between the nanostructures 226 and the second semiconductor material 214 and/or between the contacts 228 and the second semiconductor material 214.

The nanostructures 226 form a metasurface across a portion of the second semiconductor material 214, where the metasurface extends in the x-direction and the y-direction. The nanostructures 226 may have various shapes, e.g., cubes, cylinders, rectangular prisms, parallelepipeds, etc. The nanostructures 226 may be arranged to reflect a portion of light incident on the nanostructures 226 while allowing a portion of the light to pass through the metasurface. For example, the nanostructures 226 may reflect around 75% of incident light (e.g., between 70% and 80% of incident light), around 85% of incident light (e.g., between 80% and 90% of incident light), around 90% of incident light (e.g., between 85% and 95%, or between 88% and 92% of incident light), around 95% of incident light (e.g., between 93% and 97% of incident light), or a different amount of or range of light incident on the nanostructures 226.

The nanostructures 226 are arranged with a pitch, i.e., a center-to-center distance between neighboring nanostructures 226. For example, a pitch 232 between two adjacent nanostructures 226 is illustrated in FIG. 2. The pitch may be consistent across the metasurface, or may vary across the metasurface, as described with respect to FIG. 7. The pitch 232 of at least a portion of the nanostructures 226 may be between 100 nm to 800 nm or within a range therein, e.g., between 100 and 200 nm, between 200 and 400 nm, or between 400 and 800 nm.

The nanostructures 226 also have a width, where width is measured in the x-direction in the coordinate system shown. The width may be consistent across the metasurface, or may vary across the metasurface, as described with respect to FIG. 7. The nanostructures 226 may have a width between 40 nm to 80 nm.

The pitch 232 may be greater than the pitch 230. The width of the nanostructures 224 may be greater than the width of the nanostructures 226. In some embodiments, the pitch 232 and 230 are the same, while the width of the nanostructures 226 may be less than the width of the nanostructures 224, and the reduced width of the nanostructures 226 admits more light through the upper metasurface. In some embodiments, the widths of the nanostructures 224 and 226 are the same, while the pitch 232 is greater than the pitch 230, and the increased pitch of the nanostructure 226 admits more light through the upper metasurface.

The light emitting material 216 emits light when a voltage is applied across the micro-LED 200. In particular, a voltage difference may be applied across the micro-LED 200 by applying different voltages to the contacts 228 and the contacts 222. When light is emitted from the active layer, the light is nearly entirely reflected by the reflective metasurface formed from the nanostructures 224, and largely reflected by the reflective metasurface formed from the nanostructures 226. The light that passes through the reflective metasurface formed from the nanostructures 226 is the light emitted from the micro-LED 200.

The micro-LED 200 (and in particular, the portion of the micro-LED 200 between the two reflective surfaces) has a height 234. The height 234 may be matched to a wavelength of the light emitted by the light emitting material 216. If a quantum well is situated in a cavity surrounded by two mirrors, the standing wave pattern formed by the light reflected by the mirrors creates a local electromagnetic field. The enhanced local field results in an improvement of the radiation recombination rate, and thus may improve modulation speed of the micro-LED. This is referred to as the Purcell effect.

Figure 3:
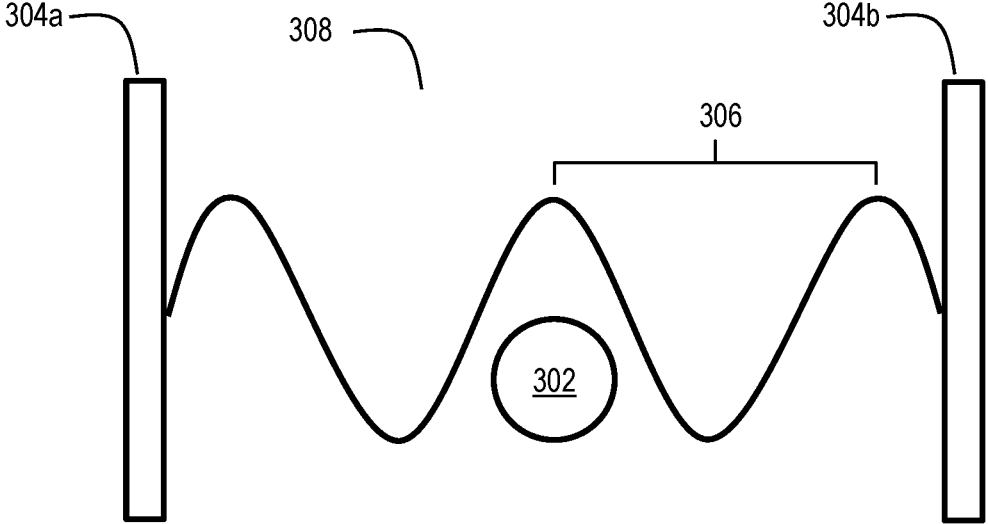
FIG. 3 is an illustration of the Purcell effect, according to various embodiments.

FIG. 3 is an illustration of the Purcell effect. In FIG. 3, an emitter 302 (e.g., an InGaN molecule) is arranged between a pair of mirrors 304*a* and 304*b*. Multiple reflections may occur between the mirrors 304*a* and 304*b*, leading to constructive interference at specific wavelengths of light. This arrangement is referred to as a Fabry-Perot resonator or Fabry-Perot cavity. In the example of FIG. 3, the emitter 302 outputs light with a wavelength 306. Much of the emitted light (e.g., around 99% of the light at the mirror 304a, and around 90% of the light at the mirror 304b, if the mirrors 304a and 304b represent the reflective surfaces of FIG. 2) is reflected into the cavity 308, while a portion of light exits the cavity 308. The reflecting light forms a standing wave pattern within the cavity 308. The standing wave pattern modifies the spontaneous emission rate of the emitter 302. In particular, based on the position of the emitter 302 and size of the resonant cavity 308 (i.e., the distance between the mirrors 304a and 304b, corresponding to the height 234 of the micro-LED 200), the emission rate of the emitter 302 is enhanced due to the increased density of electromagnetic states available for the emitter 302.

As noted above, light propagating in different directions in a two-way communications channel may have different frequencies (e.g., light from chip 1 102a to chip 2 102b may have a different frequency from the light from chip 2 102b to chip 1 102a). Thus, micro-LEDs on chip 1 102a (e.g., the micro-LED in the transmitters 108a and 108b) may have a different height 234 from the height of the micro-LEDs on chip 2 102b (e.g., the micro-LED in the transmitter 108c), to match the cavity size to the respective wavelengths.

Figure 4A:
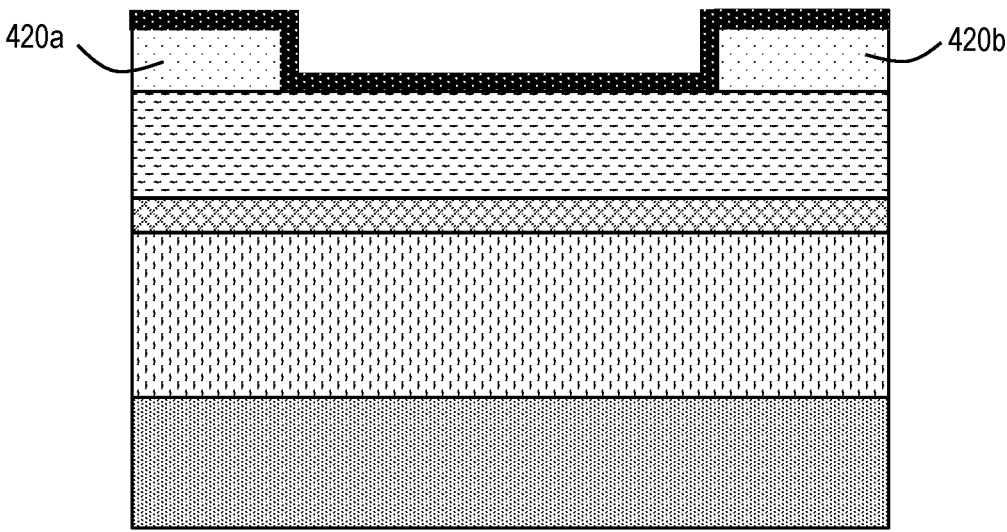
FIGS. 4A-4J illustrate various sub-processes for forming the micro-LED shown in FIG. 2, according to various embodiments.

FIGS. 4A-4J illustrate various sub-processes for forming the micro-LED shown in FIG. 2, according to various embodiments. FIG. 4A illustrates a layer of the second semiconductor material 214, a layer of the light emitting material 216, and a layer of the first semiconductor material 212 each formed over a carrier 402. The carrier may be, for example, any of the support structures described with respect to FIG. 2. Two portions 420a and 420b of the dielectric material 206 are formed over the first semiconductor material 212, and the transparent conductor 208 is formed over the dielectric material 206 and the portion of the first semiconductor material 212 between the two portions 420a and 420b of the dielectric material 206.

Figure 4B:
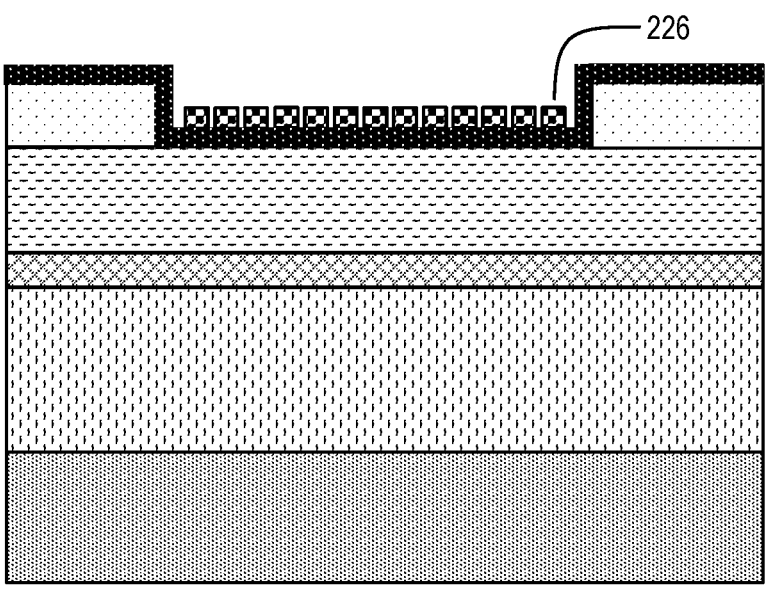

In FIG. 4B, the first set of nanostructures 224 are deposited over the transparent conductor 208, in the region between the two portions 420a and 420b of the dielectric material 206. The nanostructures 224 may be deposited using lithographic patterning and deposition techniques used in semiconductor processing. For example, a photoresist may be deposited over the assembly shown in FIG. 4A, and the photoresist may be patterned and portions of the photoresist removed. The dielectric nanostructure material 210 may then be deposited in cavities patterned in the photoresist, forming the nanostructures 224 shown in FIG. 4B, and the remaining photoresist is removed. In an alternative process, the dielectric nanostructure material 210 may be deposited across the assembly of FIG. 4A. A photoresist may be deposited over the dielectric nanostructure material 210, patterned, and a portion of the photoresist removed. Portions of the dielectric nanostructure material 210 exposed by the patterning process may then be removed, leaving the nanostructures 224 shown in FIG. 4B.

Figure 4C:
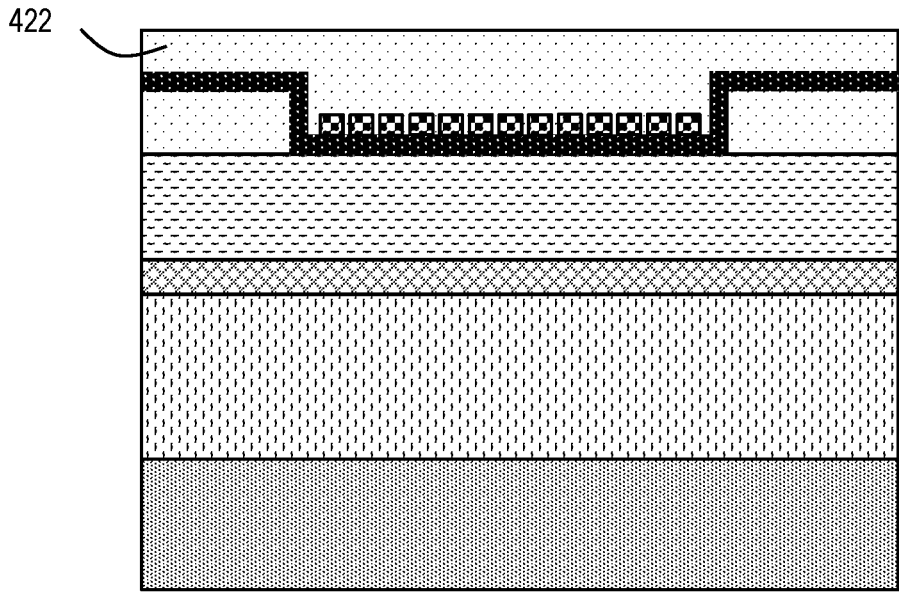

In FIG. 4C, an additional layer 422 of the dielectric material 206 is deposited over the nanostructures 226 and the exposed portions of the transparent conductor 208.

Figure 4D:
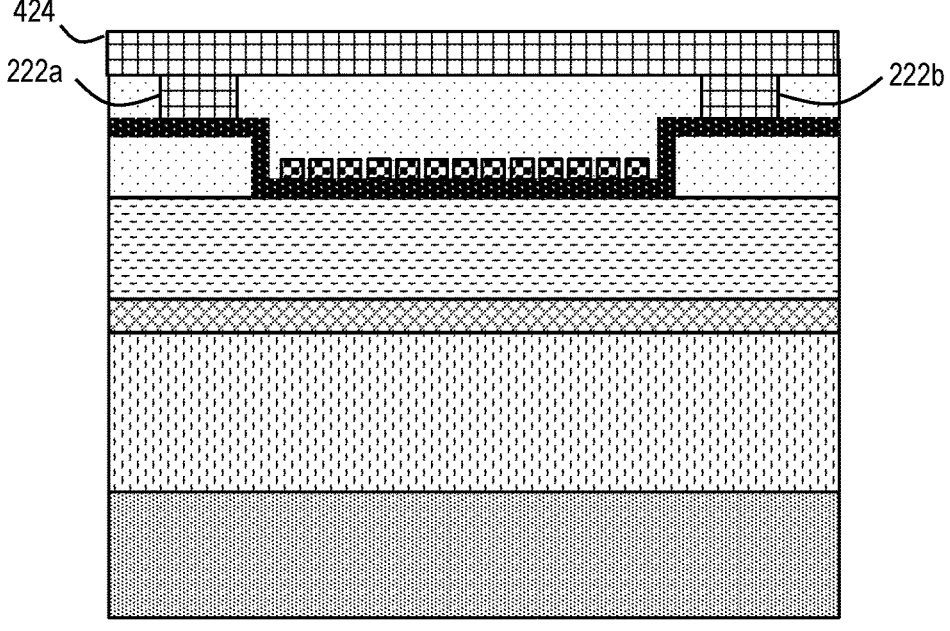

In FIG. 4D, the contacts 222a and 222b are formed within the layer 422 of the dielectric material 206. The areas for forming the contacts 222a and 222b may be patterned within the layer 422 of the dielectric material 206 using a lithographic process, e.g., as described with respect to FIG. 4B. In this example, a layer 424 of the conductive material 204 is formed over the contacts 222a and 222b and over the layer 422 of the dielectric material 206; the layer 424 electrically couples the contacts 222a and 222b.

Figure 4E:
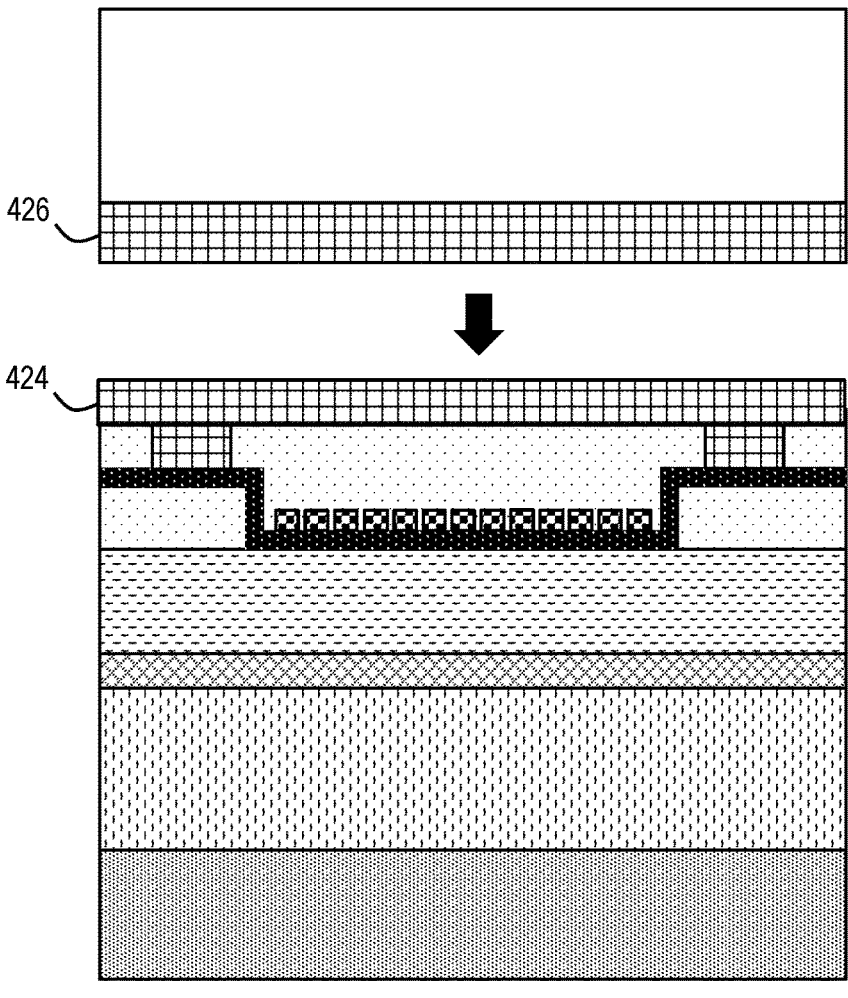
Figure 4F:
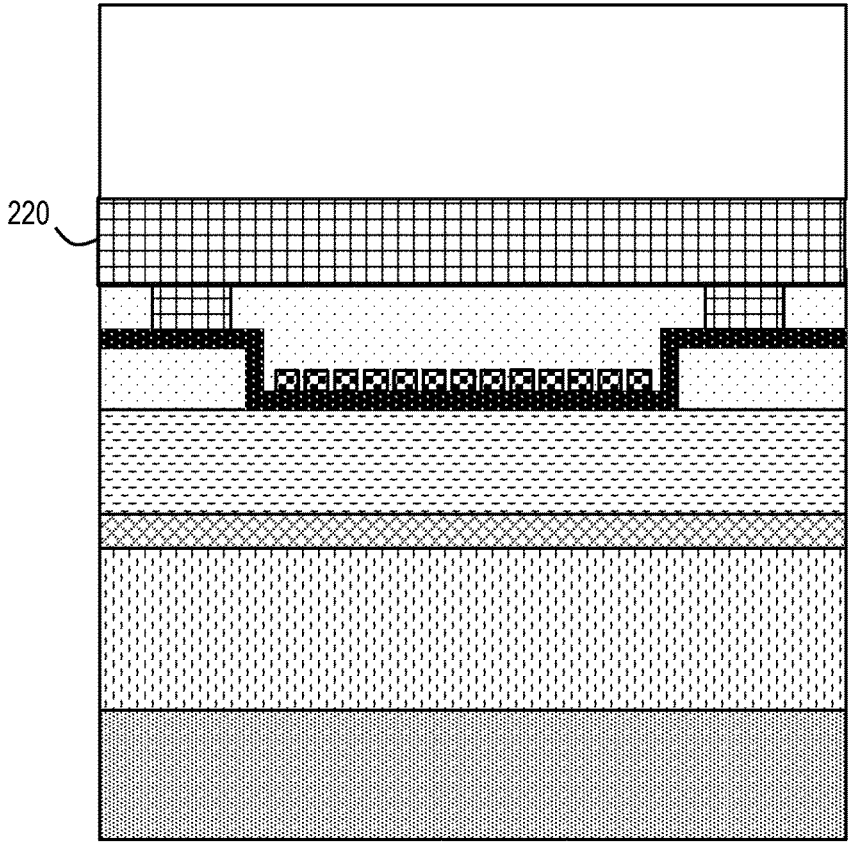

In FIG. 4E, the support structure 202 is bonded to the assembly shown in FIG. 4D. In this example, the support structure 202 includes a layer 426 of the conductive material 204; the layers 424 and 426 of the conductive material 204 are bonded together, forming the layer 220, as shown in FIG. 4F. The layers 424 and 426 may be coupled together using direct bonding, which includes metal-to-metal bonding techniques, e.g., copper-to-copper bonding, or other techniques in which bonding contacts of opposing bonding interfaces are brought into contact first, then subject to heat and compression. In other embodiments, a bonding material may be used to couple the layers 424 and 426 together to form the layer 220.

Figure 4G:
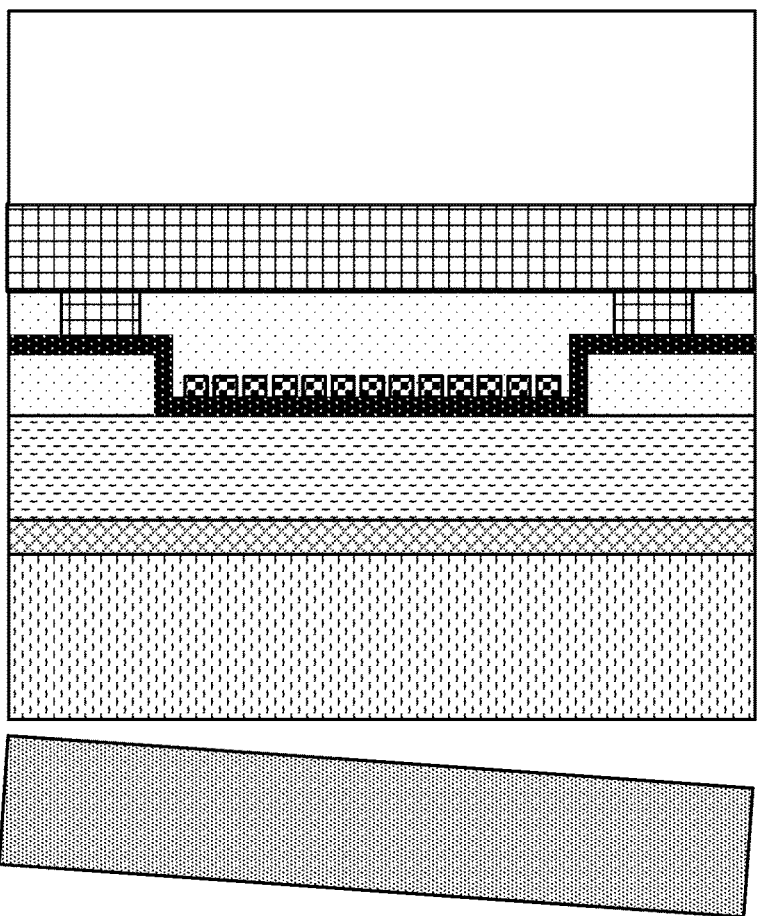

In FIG. 4G, the carrier 402 is removed from the assembly shown in FIG. 4F. For example, a laser lift-off (LLO) procedure may be used to remove the carrier 402, e.g., at a release layer in the carrier 402 or between the carrier 402 and the second semiconductor material 214. In LLO, a laser is directed at the release layer, and the material in the release layer absorbs the laser energy and experiences ablation, decomposition, or other structural changes that facilitate the separation. In other embodiments, different carrier wafer removal processes may be used. After separation, the exposed surface of the second semiconductor material 214 may be planarized.

Figure 4H:
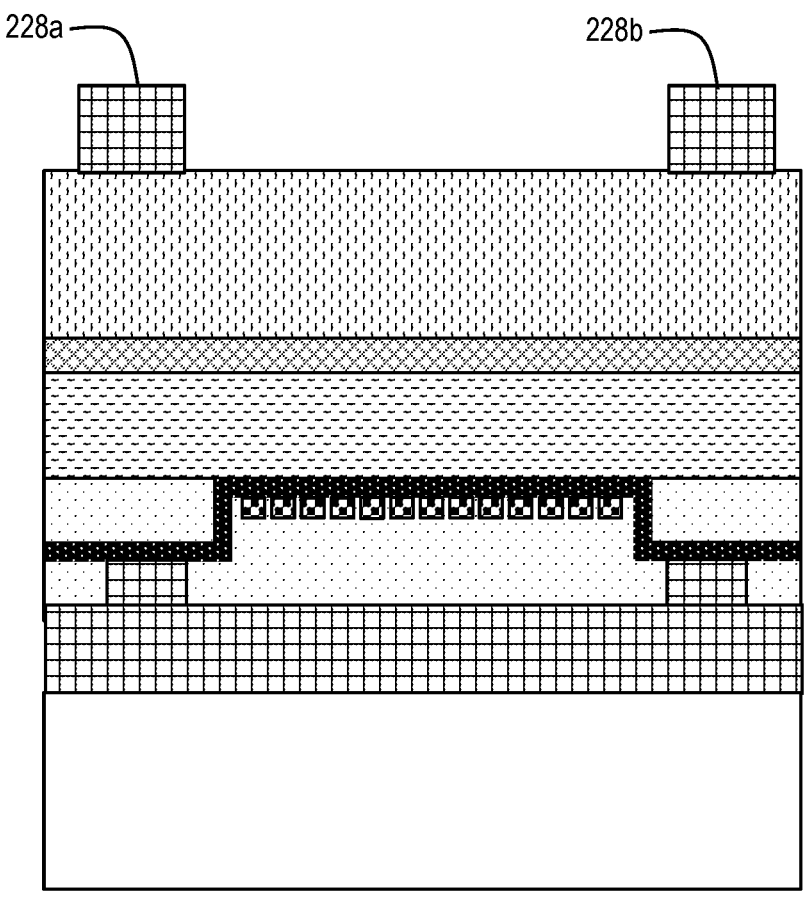

In FIG. 4H, the contacts 228a and 228b are formed over the second semiconductor material 214. The contacts 228a and 228b may be formed using a lithographic process, e.g., as described with respect to FIG. 4B.

Figure 4I:
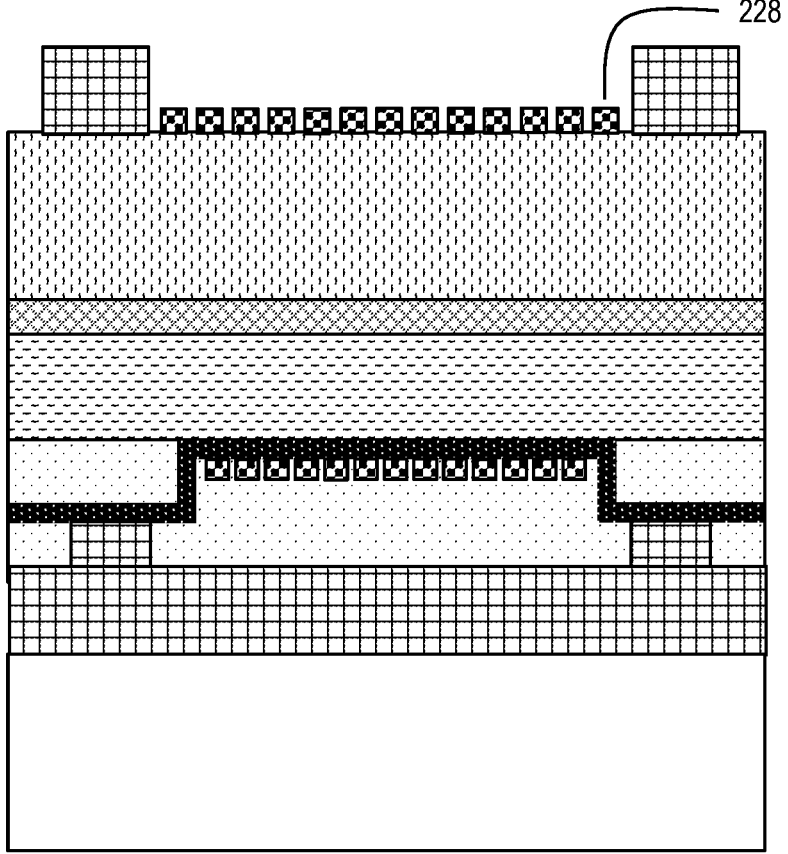

In FIG. 4I, the second set of nanostructures 226 are deposited over the second semiconductor material 214, in the region between the two contacts 228a and 228b. The nanostructures 226 may be deposited using lithographic patterning and deposition techniques, as described with respect to FIG. 4B.

Figure 4J:
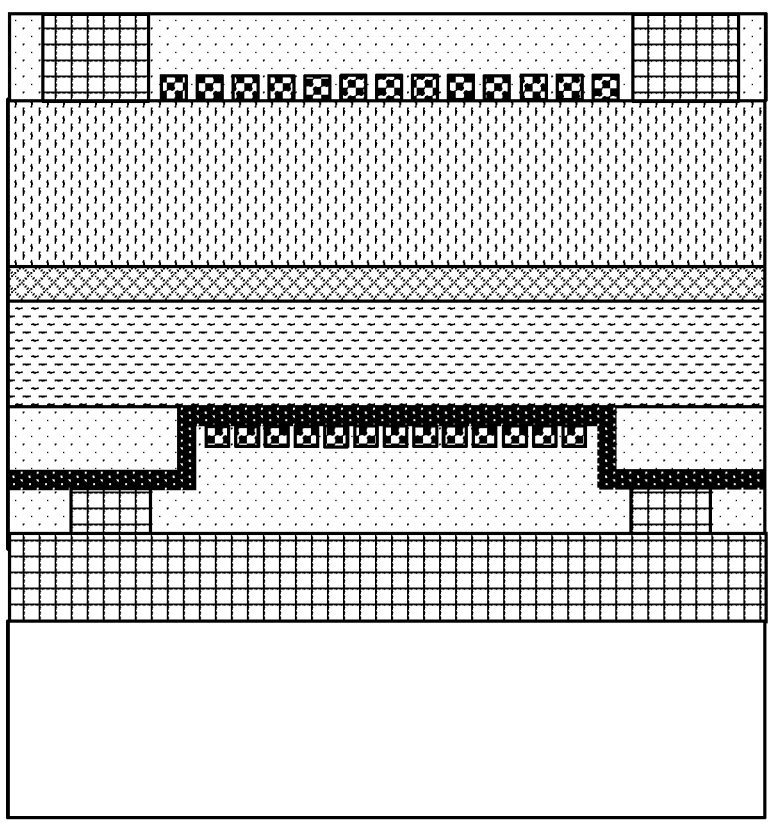

In FIG. 4J, the dielectric material 206 is deposited over the nanostructures 226 and the exposed portions of the second semiconductor material 214. The assembly shown in FIG. 4J corresponds to the micro-LED 200 shown in FIG. 2.

Figure 5A:
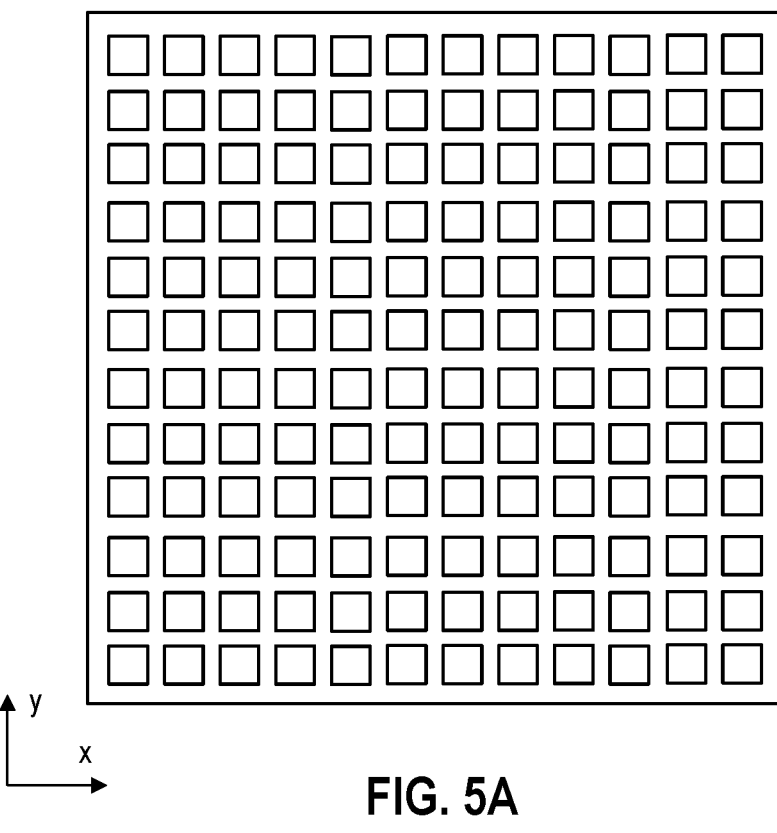
FIGS. 5A-5B, 6A-6B, and 7A-7B illustrate different embodiments of reflective metasurfaces, according to various embodiments.

FIGS. 5A-5B, 6A-6B, and 7A-7B illustrate different embodiments of reflective metasurfaces, according to various embodiments. FIG. 5A illustrates a first example cross-section of a metasurface formed by nanostructures (e.g., the nanostructures 224 or 226) in a micro-LED, e.g., the micro-LED 200. In this example, the nanostructures each have a square cross-section in the x-y plane. The nanostructures are arranged at a consistent pitch in the x-direction and y-direction; the pitch may be the same in the x- and y-directions. The nanostructures have a consistent width and may have a depth in the y-direction that is the same as the width in the x-direction.

Figure 5B:
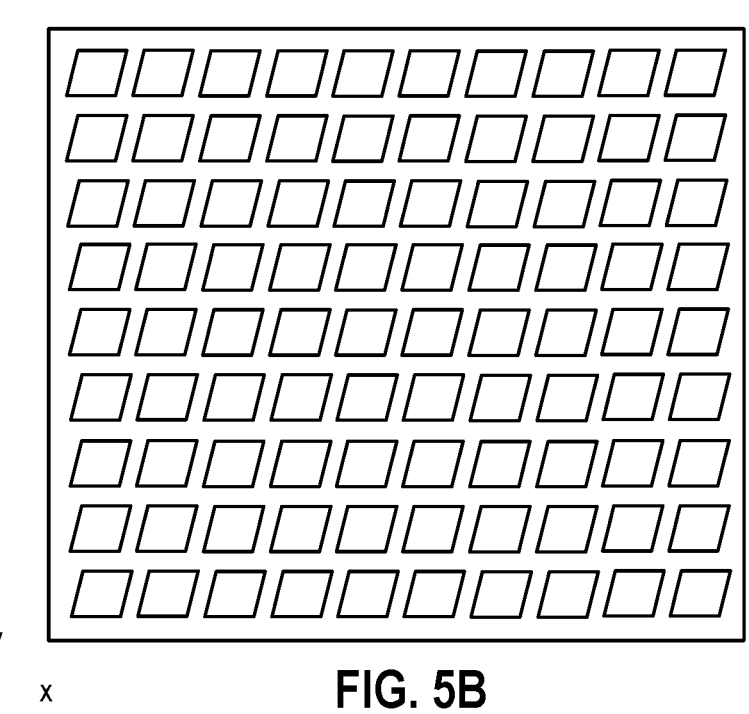

FIG. 5B illustrates a second example cross-section of a metasurface formed by nanostructures (e.g., the nanostructures 224 or 226) in a micro-LED, e.g., the micro-LED 200. In FIG. 5B, the nanostructures have a rhombus shape, or more generally, a parallelogram shape, in the x-y plane. As with FIG. 5A, the nanostructures of FIG. 5B are arranged at a consistent pitch in the x-direction and y-direction; the pitch may be the same in the x- and y-directions. The nanostructures have a consistent width and may have a depth in the y-direction that is the same as the width in the x-direction.

Figures 6A, 6B:
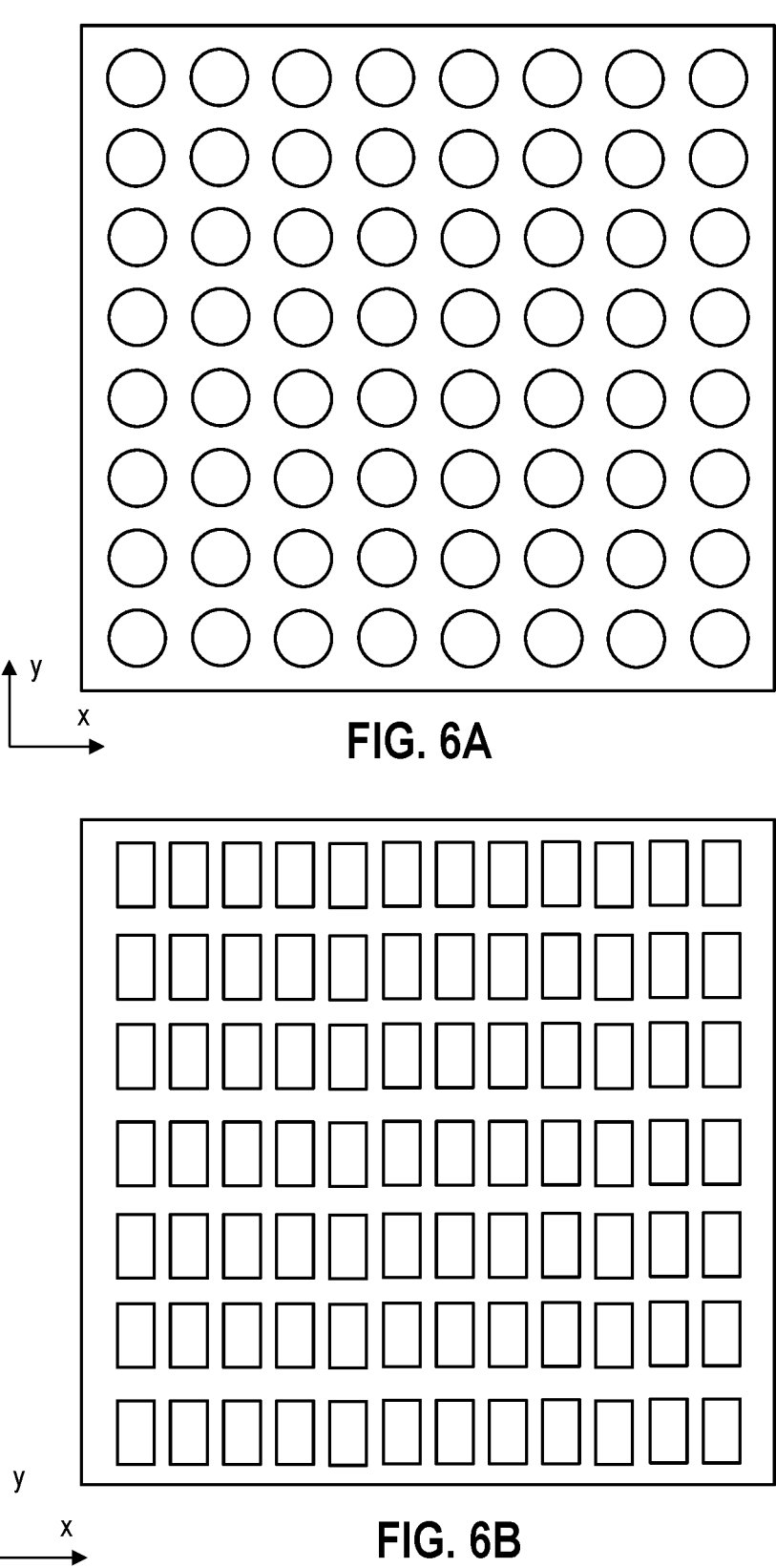

FIG. 6A illustrates a third example cross-section of a metasurface formed by nanostructures (e.g., the nanostructures 224 or 226) in a micro-LED, e.g., the micro-LED 200.

In FIG. 6A, the nanostructures have a circular shape, or more generally an oval shape, in the x-y plane. The nanostructures have a cylindrical shape in three-dimensions, which may result in nonpolarized light being output from the micro-LED. As with FIG. 5A and FIG. 5B, the nanostructures of FIG. 6A are arranged at a consistent pitch in the x-direction and y-direction; the pitch may be the same in the x- and y-directions. The nanostructures have a consistent width and may have a depth in the y-direction that is the same as the width in the x-direction.

FIG. 6B illustrates a fourth example cross-section of a metasurface formed by nanostructures (e.g., the nanostructures 224 or 226) in a micro-LED, e.g., the micro-LED 200. In FIG. 6B, the nanostructures have a rectangular shape, with a greater depth in the y-direction than the width in the x-direction. Rectangular nanostructures may result in polarized light being output from the micro-LED. The nanostructures of FIG. 6B are arranged at a consistent pitch in each of the x-direction and y-direction. The pitch may be the same in the x- and y-directions, or the pitch may be different in the x-direction and the y-direction. The nanostructures have a consistent width and depth across the metasurface.

Figures 7A, 7B:
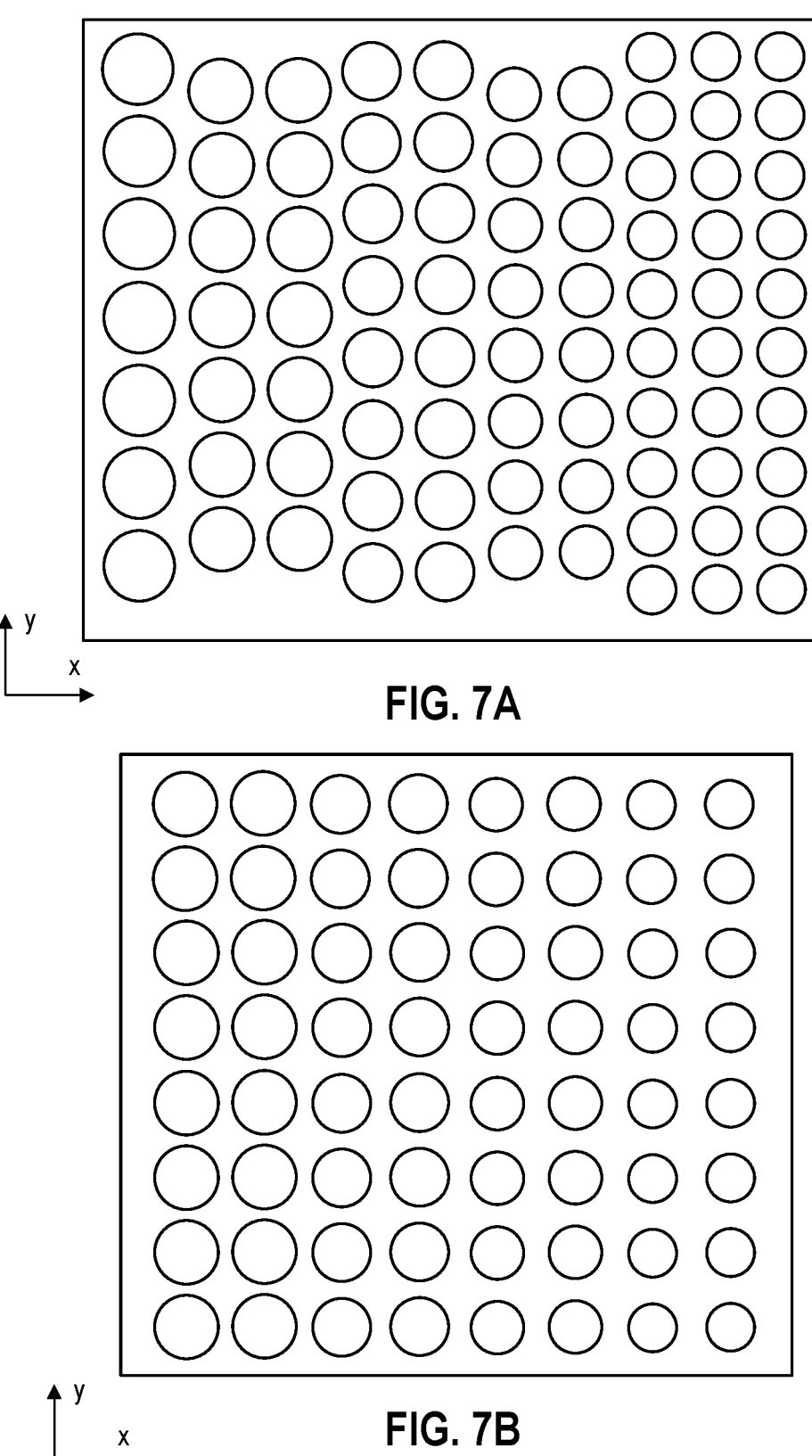

FIG. 7A illustrates a fifth example cross-section of a metasurface formed by nanostructures (e.g., the nanostructures 224 or 226) in a micro-LED, e.g., the micro-LED 200. In FIG. 7A, the nanostructures have a circular shape. The nanostructures of FIG. 7A have varying widths (or diameters) across the metasurface; moving from left to right in the x-direction, the widths of the nanostructures decrease. In addition, the pitch between adjacent nanostructures decreases moving from left to right in the x-direction across the metasurface. A distance between adjacent nanostructures remains substantially consistent across the metasurface.

FIG. 7B illustrates a sixth example cross-section of a metasurface formed by nanostructures (e.g., the nanostructures 224 or 226) in a micro-LED, e.g., the micro-LED 200. In FIG. 7B, the nanostructures again have a circular shape. The nanostructures of FIG. 7B have varying widths (or diameters) across the metasurface; moving from left to right in the x-direction, the widths of the nanostructures decrease. In this example, the pitch between adjacent nanostructures remains substantially consistent across the metasurface. However, a distance between adjacent nanostructures decreases moving from left to right in the x-direction across the metasurface.

Metasurfaces with variation across the surface, such as the examples shown in FIGS. 7A and 7B, may be used to steer light output by the micro-LED. For example, rather than light being emitted in a direction perpendicular to the metasurface, light may be angled (i.e., not perpendicular) relative to the metasurface. Light that is emitted at an angle can be used to route light transmitted from the micro-LED, e.g., to direct light in free space, or through a waveguide that is coupled to the micro-LED at an angle.

Figure 8:
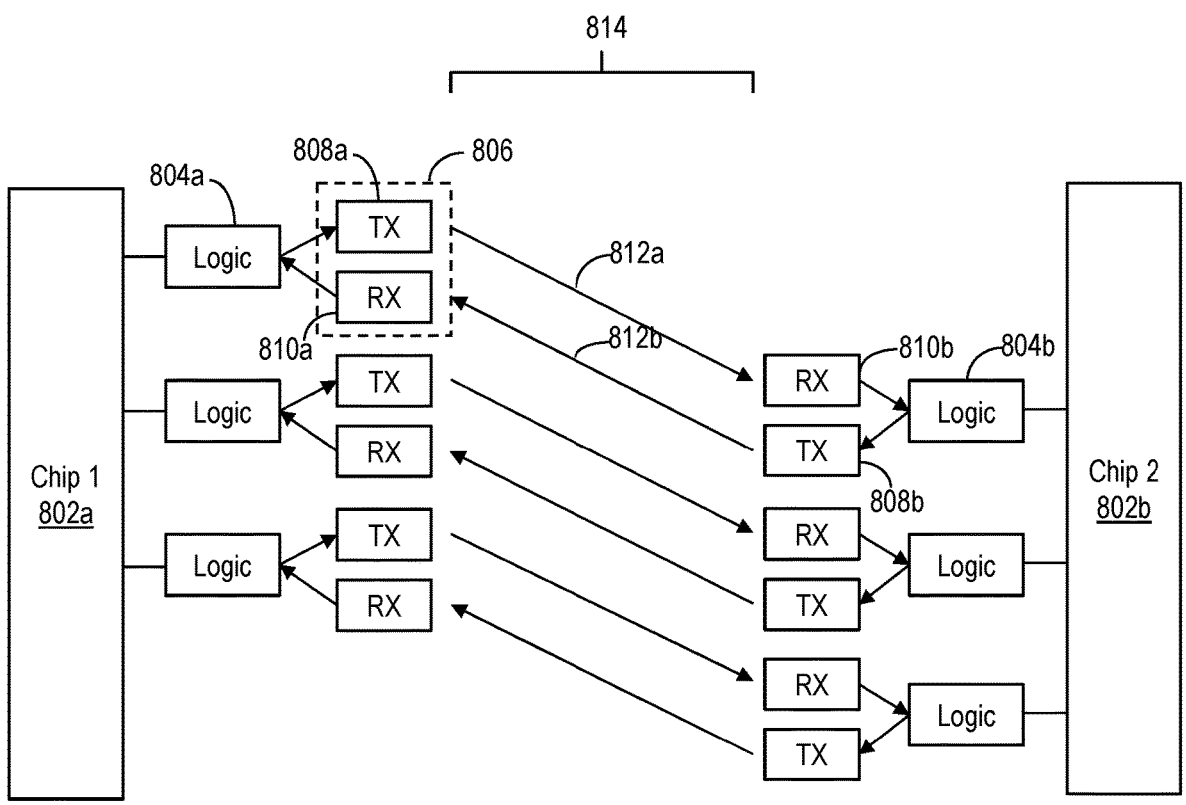
FIG. 8 is a block diagram of a micro-LED based system for free-space optical communication, according to various embodiments.

FIG. 8 is a block diagram of a micro-LED based system for free-space optical communication, according to various embodiments. FIG. 8 includes two chips 802a and 802b, which are similar to the chips 102a and 102b of FIG. 1. Each chip 802 is coupled to a set of communications logic blocks 804, which is coupled to a respective transmit/receive (TX/RX) pixel 806. Each TX/RX pixel 806 includes a transmitter 808 and a receiver 810. For example, the TX/RX pixel 806 labelled in FIG. 8 includes a transmitter 808a and a receiver 810a. The logic blocks 804 and TX/RX pixels 806 are similar to the logic blocks 104 and TX/RX pixels 106 of FIG. 1.

Each transmitter 808 may include a micro-LED with reflective metasurfaces, e.g., the micro-LED illustrated in FIG. 2. The transmitters 808 are similar to the transmitters 108 described with respect to FIG. 1, e.g., the micro-LED 200. In this example, the transmitters 808 include micro-LEDs with metasurfaces that steer the light coming out of the micro-LEDs, e.g., the metasurfaces shown in FIG. 7A or 7B.

In this example, the transmitters 808 and receivers 810 are coupled to a free space region 814, rather than waveguides. Pathways 812 between the transmitters 808 and receivers 810 are illustrated in FIG. 8. The pathways 812 extend at an angle relative to the transmitters 808. For example, the pathway 812a from the transmitter 808a to the receiver 810b does not extend perpendicularly from the transmitter 808a, and the transmitter 808a is offset in the vertical direction on the drawing page from the receiver 810b. Likewise, the pathways 812b from the transmitter 808b to the receiver 810a is angled relative to the transmitter 808b, and the transmitter 808b is offset from the receiver 810a. As noted above, the pathways 812 extend through a free space region 814, which may be an air gap, vacuum, or another non-guided transmission medium. In other examples, the pathways 812 extend through waveguides, e.g., the waveguides 112.

Figure 10:
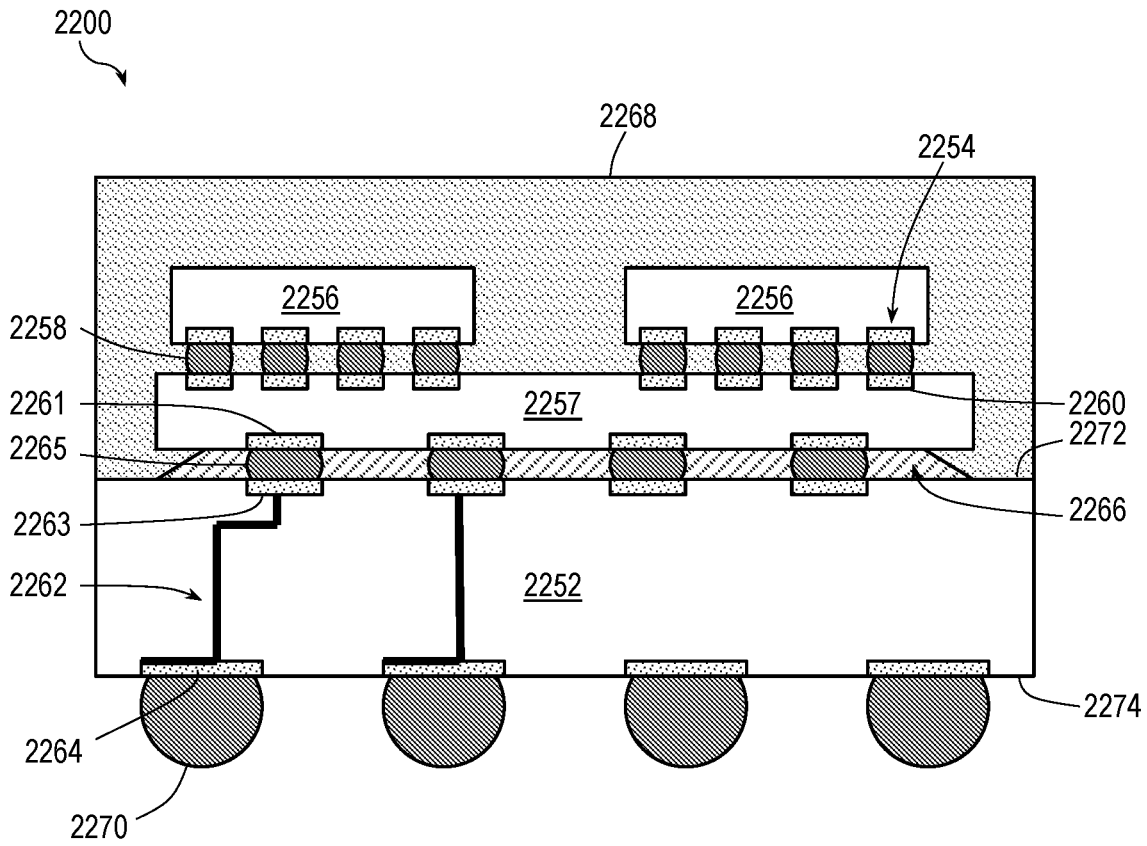
FIG. 10 is a side, cross-sectional view of an example microelectronic package that may include one or more micro-LEDs with reflective metasurfaces, according to an embodiment.
Figure 11:
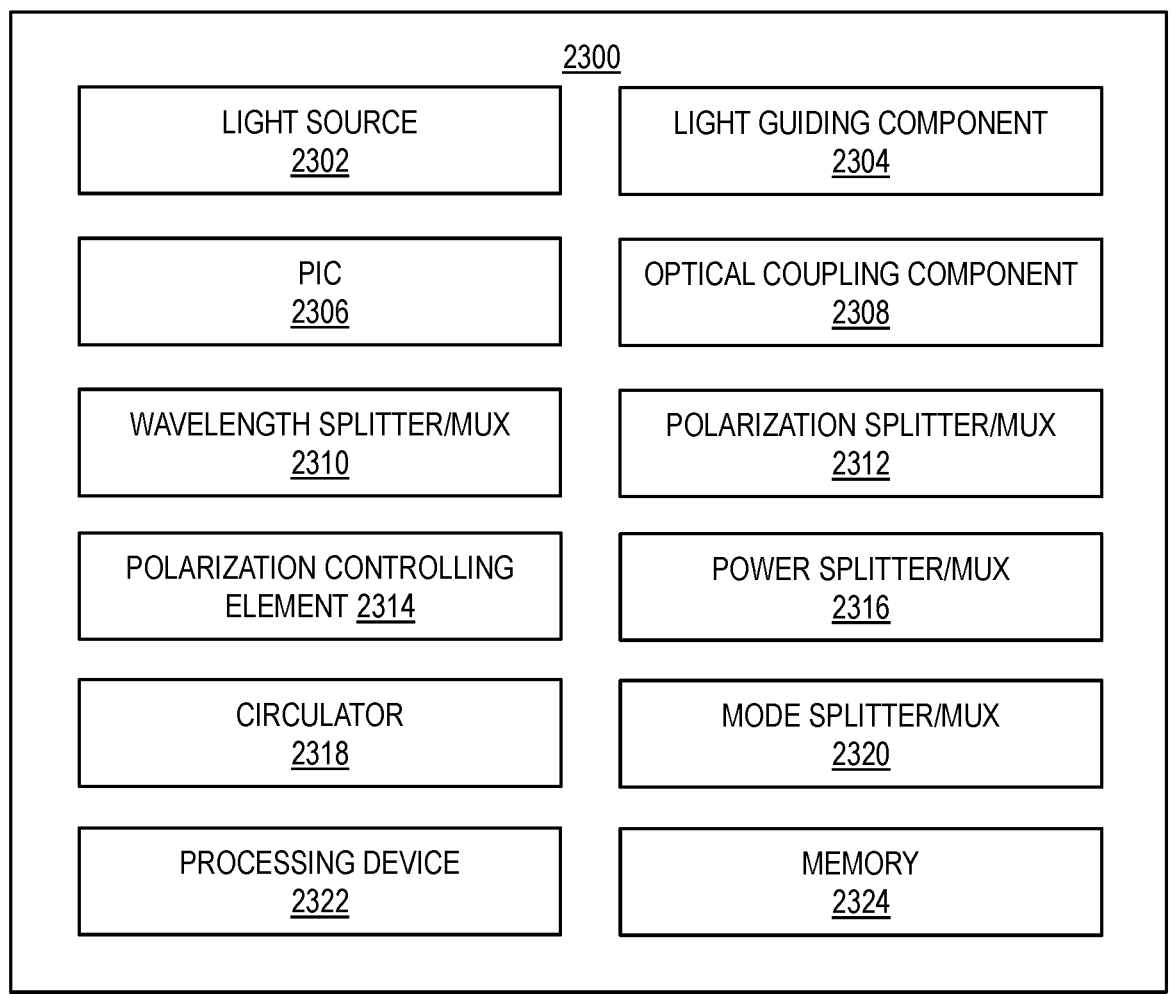
FIG. 11 is a block diagram of a photonic device that may include one or more micro-LEDs with reflective metasurfaces, according to an embodiment.

Arrangements with one or more micro-LEDs with reflective metasurfaces as disclosed herein may be included in any suitable component or electronic device. FIGS. 9-11 illustrate various examples of devices and components that may include one or more micro-LEDs with reflective metasurfaces as disclosed herein.

FIG. 9 illustrates top views of a wafer 2100 and dies 2102 that may include one or more micro-LEDs with reflective metasurfaces in accordance with any of the embodiments disclosed herein. In some embodiments, the dies 2102 may be included in an IC package, in accordance with any of the embodiments disclosed herein. For example, any of the dies 2102 may serve as any of the dies 2256 in an IC package 2200 shown in FIG. 10. The wafer 2100 may be composed of semiconductor material and may include one or more dies 2102 having IC structures formed on a surface of the wafer 2100. Each of the dies 2102 may be a repeating unit of a semiconductor product that includes any suitable IC (e.g., ICs including one or more photonic integrated circuits (PICs) as described herein, e.g., the PIC 2306 of FIG. 11). At least some of the dies 2102 may further include one or more micro-LEDs with reflective metasurfaces implemented on or attached to the die 2102. After the fabrication of the semiconductor product is complete (e.g., after manufacture of any embodiment of the micro-LEDs with reflective metasurfaces as disclosed herein), the wafer 2100 may undergo a singulation process in which each of the dies 2102 is separated from one another to provide discrete "chips" of the semiconductor product. In particular, devices that include one or more micro-LEDs with reflective metasurfaces as disclosed herein may take the form of the wafer 2100 (e.g., not singulated) or the form of the die 2102 (e.g., singulated). The die 2102 may include supporting circuitry to route electrical and/or optical signals to various components, e.g., to various micro-LEDs with reflective metasurfaces, as well as to various transistors, capacitors, resistors, or any other IC components.

FIG. 10 is a side, cross-sectional view of an example microelectronic package 2200 that may include one or more micro-LEDs with reflective metasurfaces in accordance with any of the embodiments disclosed herein. In some embodiments, the microelectronic package 2200 may be a system-in-package (SiP).

The package substrate 2252 may be formed of a dielectric material (e.g., a ceramic, a buildup film, an epoxy film having filler particles therein, etc.), and may have conductive pathways 2262 extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The microelectronic package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 10 are solder bumps, but any suitable first-level interconnects 2265 may be used. In some embodiments, no interposer 2257 may be included in the microelectronic package 2200; instead, the dies 2256 may be coupled directly to the conductive contacts 2263 at the face 2272 by first-level interconnects 2265.

The microelectronic package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 10 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 10 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the microelectronic package 2200 to another component, such as a circuit board (e.g., a motherboard), an interposer, or another IC package, as known in the art.

The dies 2256 may take the form of any of the embodiments of the die 2102 discussed herein (e.g., may include any of the embodiments of the IC devices implementing micro-LEDs with reflective metasurfaces as disclosed herein). In embodiments in which the microelectronic package 2200 includes multiple dies 2256, the microelectronic package 2200 may be referred to as a multi-chip package (MCP). The dies 2256 may include circuitry to perform any desired functionality. In some embodiments, any of the dies 2256 may include one or more micro-LEDs with reflective metasurfaces as discussed above; in some embodiments, at least some of the dies 2256 may not include any micro-LEDs.

The microelectronic package 2200 illustrated in FIG. 10 may be a flip chip package, although other package architectures may be used. For example, the microelectronic package 2200 may be a ball grid array (BGA) package, such as an embedded wafer-level ball grid array (eWLB) package. In another example, the microelectronic package 2200 may be a wafer-level chip scale package (WLCSP) or a panel fan-out (FO) package. Although two dies 2256 are illustrated in the microelectronic package 2200 of FIG. 10, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

FIG. 11 is a block diagram of an example photonic device 2300 that may include one or more components in which the micro-LEDs with reflective metasurfaces as disclosed herein may be implemented. For example, any suitable ones of the components of the photonic device 2300 may include a die (e.g., the die 2102 of FIG. 9) having one or more microelectronic packages (e.g., microelectronic packages 2200 of FIG. 10).

A number of components are illustrated in FIG. 11 as included in the photonic device 2300, but any one or more of these components may be omitted or duplicated, as suitable for the application. In some embodiments, some or all of the components included in the photonic device 2300 may be attached to one or more motherboards or any suitable support structure. In some embodiments, some or all of these components are fabricated onto a single system-on-chip (SoC) die. Additionally, in various embodiments, the photonic device 2300 may not include one or more of the components illustrated in FIG. 11, but the photonic device 2300 may include interface circuitry for coupling to the one or more components. For example, the photonic device 2300 may not include a processing device 2322, but may include processing device interface circuitry (e.g., a connector and driver circuitry) to which a processing device 2322 may be coupled. In another example, the photonic device 2300 may not include a memory 2324, but may include memory interface circuitry (e.g., connectors and supporting circuitry) to which a memory 2324 may be coupled. In yet another example, the photonic device 2300 may not include a circulator 2318, but may include circulator interface circuitry (e.g., connectors) to which a circulator 2318 may be coupled In some embodiments, the photonic device 2300 may include at least one light source 2302. The light source 2302 may include any suitable device for providing the necessary optical signals for various applications of the photonic device 2300, ranging from communication to sensing and imaging. The light source 2302 may be designed to emit light in a controlled and efficient manner to meet the specific requirements of the photonic device 2300. In some embodiment, the light source 2302 may be a coherent and monochromatic light source such as a laser, to produce light of a well-defined wavelength, low divergence, and high brightness. Examples of lasers that may be included in the light source 2302 include semiconductor lasers, such as edge-emitting lasers and vertical-cavity surface-emitting lasers (VCSELs). Such lasers may be particularly advantageous when the photonic device 2300 is used in applications like optical communication, sensing, and laser-based treatments in medical devices. In some embodiment, the light source 2302 may be a non-coherent light source such as an LED that emits light when an electric current is applied. LEDs may be simpler and more cost-effective than lasers, making them suitable for applications where high coherence is not required. Using an LED as the light source 2302 may be particularly advantageous when the photonic device 2300 is used in applications like displays, optical sensors, and short-distance communication systems. In further embodiments, the light source 2302 may include one or more of a superluminescent diode (SLD), a quantum dot, a rare-earth-doped fiber/waveguide, a plasma source (e.g., plasmonics and microplasma devices), a microcavity resonators, or a nonlinear optical device (e.g., a photonic device that uses nonlinear optical processes, such as frequency doubling or parametric amplification, to generate new wavelengths).

In some embodiments, the photonic device 2300 may include at least one light guiding component 2304, such as a waveguide, to manipulate and control the propagation of light. The light guiding component 2304 may include any suitable waveguide structures designed to confine and guide light along a specified path, allowing it to travel from one point to another with minimal loss and dispersion. Examples of waveguides that may be used as the light guiding component 2304 include planar waveguides, optical fibers, photonic crystal waveguides, and rib waveguides. In some embodiments, the light guiding component 2304 may include a material with a higher refractive index, known as the "core," surrounded by a material with a lower refractive index, known as the "cladding." The refractive index contrast between the core and cladding helps guide light within the core by using total internal reflection. Light is trapped within the core due to its reflection at the core-cladding interface. The light guiding component 2304 may support various modes of light propagation, such as single-mode or multimode.

In some embodiments, the photonic device 2300 may include at least one PIC 2306. A PIC 2306 may be a miniaturized and integrated optical device that incorporates photonic components, such as optical modulators, photodetectors, and waveguides, onto a single substrate. In some embodiments, the PIC 2306 may include one or more optical modulators for encoding data onto an optical signal, e.g., onto light generated by the light source 2302. An optical modulator of the PIC 2306 may change certain properties of an optical signal, such as its amplitude, frequency, or phase, in order to encode information onto the signal or to perform various signal processing functions. Examples of optical modulators that may be implemented in the PIC 2306 include electro-optic modulators, Mach-Zehnder Interferometric (MZI) modulators, or microring modulators. In some embodiments, the PIC 2306 may include one or more photodetectors for detecting and measuring the intensity of light or optical radiation across various wavelengths by converting incident light/photons into an electrical signal. Examples of photodetectors that may be implemented in the PIC 2306 include photodiodes, avalanche photodiodes, phototransistors, PIN diodes, CMOS image sensors, photomultiplier tubes, or quantum photodetectors. In some embodiments, the PIC 2306 may include one or more waveguides, e.g., any of the waveguides described with reference to the light guiding component 2304.

In some embodiments, the photonic device 2300 may include at least one optical coupling component 2308. The optical coupling component 2308 may include any suitable structures designed to facilitate efficient transfer of light between different optical devices, e.g., between the light source 2302 and the light guiding component 2304, between the light source 2302 and the PIC 2306, between the light guiding component 2304 and the PIC 2306, or between the light guiding component 2304 or the PIC 2306 and a further transmission line such as a fiber (not shown in FIG. 11) that may be coupled to the photonic device 2300. Examples of optical coupling elements that may be used to implement the optical coupling component 2308 include fiber couplers (e.g., fused fiber couplers or tapered fiber couplers), waveguide couplers, grating couplers, lens couplers, microlens couplers, prism couplers, fiber array couplers, or ball lens couplers. In some embodiment, the optical coupling component 2308 may include one or more micro-LEDs with reflective metasurfaces as described herein.

In some embodiments, the photonic device 2300 may include at least one wavelength splitter/multiplexer 2310, to combine or split multiple optical signals that are carried at different wavelengths. This may be particular advantageous if the photonic device 2300 is used in an optical communication system such as a wavelength division multiplexing (WDM) system or a dense wavelength division multiplexing (DWDM) system, where multiple data channels are transmitted simultaneously over a single optical fiber using different wavelengths of light. In various embodiments, the wavelength splitter/multiplexer 2310 may include a wavelength division multiplexer, a wavelength division demultiplexer, a passive optical add/drop multiplexer, an arrayed waveguide grating, a fused fiber couplers, and interleavers, or an optical filter-based device.

In some embodiments, the photonic device 2300 may include at least one polarization splitter/multiplexer 2312, to combine or split multiple optical signals depending on their polarization. Similarly, in some embodiments, the photonic device 2300 may include at least one polarization controlling component 2314, to control polarization of light generated and manipulated in the photonic device 2300. In various embodiments, a polarization splitter/multiplexer 2312 and a polarization controlling component 2314 may include any suitable structure to enable the manipulation and management of polarized light signals, such as birefringent materials, waveguide structures, or specialized coatings that interact differently with different polarization states.

In some embodiments, the photonic device 2300 may include at least one general power splitter/multiplexer 2316, to combine or split multiple optical signals that in a manner that is not dependent on wavelength or polarization. For example, in some embodiments a power splitter/multiplexer 2316 may be used to tap off a small amount of optical power for purposes or power monitoring in the photonic device 2300. Examples of devices that may be used as a power splitter/multiplexer 2316 include directional couplers and multimode interference couplers.

In some embodiments, the photonic device 2300 may include at least one circulator 2318, also referred to as a "directional splitter." The circulator 2318 may include any suitable device configured to direct light signals to travel in a specific, one-way circular path through its ports. In some embodiments, the circulator 2318 may include magneto-optic materials or other techniques that create a Faraday rotation effect, where the polarization of light is rotated as it passes through the circulator 2318.

In some embodiments, the photonic device 2300 may include at least one mode splitter/multiplexer 2320, to combine or split multiple optical signals based on their guided modes. Examples of devices that may be used as a mode splitter/multiplexer 2320 include directional couplers, multimode interference couplers, tapered waveguide couplers, photonic lanterns, or photonic crystal splitters.

In some embodiments, the photonic device 2300 may include a processing device 2322 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2322 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some embodiments, the processing device 2322 may include circuitry to control operation of other components of the photonic device 2300, e.g., to control operation of the PIC 2306.

In some embodiments, the photonic device 2300 may include a memory 2324, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2322. This memory may be used as cache memory and may include embedded DRAM (eDRAM) or spin transfer torque magnetic random-access memory (MRAM). In some embodiments, the memory 2324 may store instructions or data for the processing device 2322 to control operation of other components of the photonic device 2300, e.g., to control operation of the PIC 2306.

The following paragraphs provide examples of various ones of the embodiments disclosed herein.

Example 1 provides a device including a first dielectric layer including a first plurality of discrete dielectric structures, at least a first portion of the first plurality of discrete dielectric structures arranged at a first pitch; a second dielectric layer including a second plurality of discrete dielectric structures, at least a second portion of the second plurality of discrete dielectric structures arranged at a second pitch, where the first pitch is greater than the second pitch; and a layer of light-emitting material between the first dielectric layer and the second dielectric layer.

Example 2 provides the device of example 1, further including a semiconductor layer between the first dielectric layer and the layer of light-emitting material, where the first plurality of discrete dielectric structures are on the semiconductor layer.

Example 3 provides the device of example 2, further including a second semiconductor layer between the second dielectric layer and the layer of light-emitting material; and a layer of transparent conductive material between the second semiconductor layer and the second dielectric layer, where the second plurality of discrete dielectric structures are on the layer of transparent conductive material.

Example 4 provides the device of any of the preceding examples, where at least the first portion of the first plurality of discrete dielectric structures have a first width, and at least the second portion of the second plurality of discrete dielectric structures have a second width less than the first width.

Example 5 provides the device of any of the preceding examples, where the first dielectric layer is configured to reflect at least 90% of the light emitted by the layer of light-emitting material.

Example 6 provides the device of any of the preceding examples, where the second dielectric layer is configured to reflect at least 99% of the light emitted by the layer of light-emitting material.

Example 7 provides an apparatus including a first layer including a first plurality of dielectric structures across at least a portion of the first layer, an adjacent pair of the first plurality of dielectric structures having a first pitch; a second layer over the first layer, the second layer including a transparent conductor; a third layer over the second layer, the third layer including indium, gallium and nitrogen; and a fourth layer including a second plurality of dielectric structures across at least a portion of the fourth layer, an adjacent pair of the second plurality of dielectric structures having a second pitch less than the first pitch.

Example 8 provides the apparatus of example 7, further including a fifth layer between the first layer and the second layer, the fifth layer including gallium and nitrogen; and a sixth layer between the second layer and the third layer, the sixth layer including gallium and nitrogen.

Example 9 provides the apparatus of example 8, the fourth layer further including a first conductive structure and a second conductive structure, where the second plurality of dielectric structures are between the first conductive structure and the second conductive structure.

Example 10 provides the apparatus of example 9, further including a third conductive structure coupled to the transparent conductor.

Example 11 provides the apparatus of any of examples 7-10, where each of the adjacent pair of the first plurality of dielectric structures have a first width, each of the adjacent pair of the second plurality of dielectric structures have a second width, the first width greater than the second width.

Example 12 provides the apparatus of any of examples 7-11, where the first plurality of dielectric structures includes a second adjacent pair having a third pitch greater than the first pitch.

Example 13 provides the apparatus of any of examples 7-12, where the first pitch is between 100 nm and 800 nm, and where the second pitch is between 100 nm and 800 nm.

Example 14 provides the apparatus of any of examples 7-13, where the first plurality of dielectric structures include titanium and oxygen.

Example 15 provides the apparatus of any of examples 7-14, where the first layer has a first reflectivity of at least 90%, and the third layer has a second reflectivity of at least 99%.

Example 16 provides an assembly including a die; and a plurality of optical transmitters coupled to the die, one of the optical transmitters including a micro-light emitting diode (micro-LED), the micro-LED including a first layer including a first plurality of dielectric structures, an adjacent pair of the first plurality of dielectric structures having a first pitch; a second layer including a second plurality of dielectric structures, an adjacent pair of the second plurality of dielectric structures having a second pitch less than the first pitch; and a third layer between the first layer and the second layer, the third layer including a light-emitting material.

Example 17 provides the assembly of example 16, further including a plurality of optical receivers, where one of the plurality of optical transmitters and one of the plurality of optical receivers are arranged in a transmit/receive pixel.

Example 18 provides the assembly of example 17, further including a second plurality of optical transmitters, each of the second plurality of optical transmitters coupled to a respective one of the plurality of optical receivers.

Example 19 provides the assembly of example 18, where the first layer and the second layer are arranged at a first distance, a second one of the second plurality of optical transmitters includes a fourth layer including a third plurality of dielectric structures; and a fifth layer including a fourth plurality of dielectric structures, where the fourth layer and the fifth layer are arranged at a second distance greater than the first distance.

Example 20 provides the assembly any of examples 16-19, where each of the plurality of optical transmitters is coupled to a waveguide.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A device comprising:
a first dielectric layer comprising a first plurality of discrete dielectric structures, at least a first portion of the first plurality of discrete dielectric structures arranged at a first pitch;
a second dielectric layer comprising a second plurality of discrete dielectric structures, at least a second portion of the second plurality of discrete dielectric structures arranged at a second pitch, wherein the first pitch is greater than the second pitch; and
a layer of light-emitting material between the first dielectric layer and the second dielectric layer.

2. The device of claim 1, further comprising a semiconductor layer between the first dielectric layer and the layer of light-emitting material, wherein the first plurality of discrete dielectric structures are on the semiconductor layer.

3. The device of claim 2, further comprising:
a second semiconductor layer between the second dielectric layer and the layer of light-emitting material; and
a layer of transparent conductive material between the second semiconductor layer and the second dielectric layer, wherein the second plurality of discrete dielectric structures are on the layer of transparent conductive material.

4. The device of claim 1, wherein at least the first portion of the first plurality of discrete dielectric structures have a first width, and at least the second portion of the second plurality of discrete dielectric structures have a second width less than the first width.

5. The device of claim 1, wherein the first dielectric layer is configured to reflect at least 90% of the light emitted by the layer of light-emitting material.

6. The device of claim 1, wherein the second dielectric layer is configured to reflect at least 99% of the light emitted by the layer of light-emitting material.

7. An apparatus comprising:
a first layer comprising a first plurality of dielectric structures across at least a portion of the first layer, an adjacent pair of the first plurality of dielectric structures having a first pitch;
a second layer over the first layer, the second layer comprising a transparent conductor;
a third layer over the second layer, the third layer comprising indium, gallium and nitrogen; and
a fourth layer comprising a second plurality of dielectric structures across at least a portion of the fourth layer, an adjacent pair of the second plurality of dielectric structures having a second pitch less than the first pitch.

8. The apparatus of claim 7, further comprising:
a fifth layer between the first layer and the second layer, the fifth layer comprising gallium and nitrogen; and
a sixth layer between the second layer and the third layer, the sixth layer comprising gallium and nitrogen.

9. The apparatus of claim 7, the fourth layer further comprising a first conductive structure and a second conductive structure, wherein the second plurality of dielectric structures are between the first conductive structure and the second conductive structure.

10. The apparatus of claim 9, further comprising a third conductive structure coupled to the transparent conductor.

11. The apparatus of claim 7, wherein each of the adjacent pair of the first plurality of dielectric structures have a first width, each of the adjacent pair of the second plurality of dielectric structures have a second width, the first width greater than the second width.

12. The apparatus of claim 7, wherein the first plurality of dielectric structures comprises a second adjacent pair having a third pitch greater than the first pitch.

13. The apparatus of claim 7, wherein the first pitch is between 100 nm and 800 nm, and wherein the second pitch is between 100 nm and 800 nm.

14. The apparatus of claim 7, wherein the first plurality of dielectric structures comprise titanium and oxygen.

15. The apparatus of claim 7, wherein the first layer has a first reflectivity of at least 90%, and the third layer has a second reflectivity of at least 99%.

16. An assembly comprising:
a die; and
a plurality of optical transmitters coupled to the die, one of the optical transmitters comprising a micro-light emitting diode (micro-LED), the micro-LED comprising:
a first layer comprising a first plurality of dielectric structures, an adjacent pair of the first plurality of dielectric structures having a first pitch;
a second layer comprising a second plurality of dielectric structures, an adjacent pair of the second plurality of dielectric structures having a second pitch less than the first pitch; and
a third layer between the first layer and the second layer, the third layer comprising a light-emitting material.

17. The assembly of claim 16, further comprising a plurality of optical receivers, wherein one of the plurality of optical transmitters and one of the plurality of optical receivers are arranged in a transmit/receive pixel.

18. The assembly of claim 17, further comprising a second plurality of optical transmitters, each of the second plurality of optical transmitters coupled to a respective one of the plurality of optical receivers.

19. The assembly of claim 18, wherein the first layer and the second layer are arranged at a first distance, a second one of the second plurality of optical transmitters comprises:

a fourth layer comprising a third plurality of dielectric structures; and a fifth layer comprising a fourth plurality of dielectric structures, wherein the fourth layer and the fifth layer are arranged at a second distance greater than the first distance.

20. The assembly of claim 16, wherein each of the plurality of optical transmitters is coupled to a waveguide.

\* \* \* \* \*